US006487117B1

(12) United States Patent
Choi et al.

(10) Patent No.: US 6,487,117 B1
(45) Date of Patent: Nov. 26, 2002

(54) METHOD FOR PROGRAMMING NAND-TYPE FLASH MEMORY DEVICE USING BULK BIAS

(75) Inventors: Jeong-hyuk Choi, Suwon (KR); Yun-seung Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/494,850

(22) Filed: Feb. 1, 2000

(30) Foreign Application Priority Data

Feb. 1, 1999 (KR) .............................................. 99-3220

(51) Int. Cl.[7] .............................................. G11C 16/04
(52) U.S. Cl. .............................. 365/185.17; 365/185.27; 365/185.28
(58) Field of Search ...................... 365/185.17, 185.27, 365/185.28

(56) References Cited

U.S. PATENT DOCUMENTS 4,959,812 A * 9/1990 Momodomi et al. ........ 257/316
5,345,418 A * 9/1994 Challa .................... 365/185.17
5,357,463 A   10/1994 Kinney ........................ 365/218
6,163,048 A * 12/2000 Hirose et al. ................ 257/315

OTHER PUBLICATIONS

*Symposium on VLSI Circuits*, pp. 105–106 (Jun. 1990).
*ISSCC*, pp. 128–129 (1995).

* cited by examiner

*Primary Examiner*—Son Mai
(74) *Attorney, Agent, or Firm*—Cantor Colburn LLP

(57) ABSTRACT

A method for programming a NAND-type flash memory device is provided. In the method for programming a NAND-type flash memory device having a plurality of strings two dimensionally arranged on the bulk area of a first conductivity type and a plurality of bitlines arranged in parallel on the plurality of strings, a bulk bias corresponding to a reverse bias is applied to the bulk area of the first conductivity type. At least one bitline is selected among the plurality of bitlines. At least one string is selected from among the plurality of strings connected to the selected bitline in parallel. At least one cell is programmed from among the plurality of cells within the selected strings.

12 Claims, 5 Drawing Sheets

METHOD FOR PROGRAMMING NAND-TYPE FLASH MEMORY DEVICE USING BULK BIAS

BACKGROUND OF THE INVENTION

1. Field of the Invention

The present invention relates to a method for programming a non-volatile memory device, and more particularly, to a method for programming a NAND-type flash memory device using a bulk bias.

2. Description of the Related Art

Information stored in a non-volatile memory cell, a type of semiconductor memory device, is not erased even if power is not supplied. Accordingly, non-volatile memory devices are widely used in computers and memory cards.

Since it is easier to increase the integration degree of a NAND-type flash memory device rather than that of a NOR-type flash memory device in a non-volatile memory device, a NAND-type flash memory device is widely used in a highly integrated flash memory device.

FIG. 1 is a plan view showing part of a cell array region of a general NAND-type flash memory device. FIG. 2 is an equivalent circuit diagram showing the cell array region of FIG. 1.

Referring to FIGS. 1 and 2, active regions 1 are parallel to each other. A string selection line SSL, a plurality of word lines WL1, WL2, ..., WLn, and a ground selection line GSL which cross the active regions 1 are parallel to one another. Contacts CT for exposing the active regions are positioned in the active regions 1 adjacent to the string selection line SSL. Bit lines BL1 and BL2 electrically connected to the active regions 1 through the contacts CT pass over the respective active regions 1. Also, the active regions 1 adjacent to the ground selection line GSL are extended to the direction parallel to the ground selection line GSL to thereby operate as a common source line (CSL). String selection transistor portions SST1 and SST2 comprised of the string selection transistors are formed where the string selection line SSL crosses the respective active regions 1. Cell transistor portions CT1 and CT2 comprised of a plurality of cell transistors are formed where the respective word lines WL1, WL2, ..., WLn cross the respective active regions 1. Also, ground selection transistor portions GST1 and GST2 comprised of ground selection transistors are formed where the ground selection line GSL crosses the respective active regions 1.

Each cell transistor is comprised of a tunnel oxide film, a floating gate FG, an inter-poly dielectric layer, and a word line which operates as a control gate electrode, sequentially stacked on the active region 1. Here, the floating gates FG of the respective cell transistors are formed to be separate from each other. As shown in FIG. 1, the string selection transistor, the plurality of cell transistors, and the ground selection transistor, which are serially arranged on the active region 1 comprise one string. Also, the respective cell transistors, the respective string selection transistors, and the respective ground selection transistors are formed as NMOS transistors and are formed in a bulk region such as a P-well region.

FIG. 3 shows voltage waveforms for explaining a method for programming a cell A among a plurality of memory cells constructing the general NAND-type flash memory device shown in FIGS. 1 and 2.

Referring to FIG. 3, the moment a power supply voltage Vcc is applied for a precharge time Tpc to the first bit line BL1 serially connected to a first string including the cell A to be programmed, a pass voltage Vpass and a programming voltage Vpgm are sequentially applied to the second word line WL2 corresponding to the control gate electrode of the selected cell A for the precharge time Tpc and a programming time Tpgm, respectively. The power supply voltage Vcc is continuously applied to the string selection line SSL and the second bit line BL2 serially connected to a second string parallel to the first string for the precharge time Tpc and a programming time Tpgm. A pass voltage Vpass is applied to non-selected word lines WLns, i.e., the first word line WL1 and the third word line WL3 through the nth word line WLn for the precharge time Tpc and the programming time Tpgm. Also, 0 volts is applied to the ground selection line GSL, the common source line CSL, and the bulk region.

When predetermined voltages are applied to the respective control lines in order to program the selected cell A as mentioned above, the channel region of the selected cell A and the channel regions of the non-selected cells are precharged for the precharge time Tpc to a voltage close to the power supply voltage Vcc. However, charges precharged in the channel region of the selected cell A are discharged through the first bit line BL1 which falls down to a ground potential for the programming time Tpgm. Accordingly, 0 volts are induced to the channel region of the selected cell A. As a result, the selected cell A is programmed by the programming voltage Vpgm applied to the second word line WL2 and the channel voltage induced to 0 volts.

Meanwhile, the channel regions of the memory cells constructing the second string are electrically isolated from the second bit line BL2 and the common source line CSL for the program time Tpgm, to thereby be floated. Therefore, a voltage increased by the programming voltage Vpgm applied to the second word line WL2 is induced in the channel region of a non-selected cell B which shares the second word line WL2 with the selected cell A. Accordingly, the non-selected cell B is not programmed. At this time, a voltage Vch induced in the channel region of the non-selected cell B can be represented by Equation 1 from FIG. 4 which is a sectional view taken along the line PP' of FIG. 1 and FIG. 5 which is an equivalent circuit diagram of the non-selected cell B of FIG. 4. Here, a bulk voltage Vb applied to a bulk region 10 of FIG. 4 is 0 volts.

$$Vch = \{Ctot \div (Ctot + Cch)\} \times Vpgm \tag{b 1}$$

wherein, Ctot is the total capacitance of an inter-poly dielectric layer capacitance Cipo and a tunnel oxide film capacitance Ctox, serially connected to each other. Cch is a depletion capacitance formed in the channel region. The inter-poly dielectric layer capacitance Cipo represents the capacitance of an inter-polysilicon dielectric layer IPO interposed between the floating gate FG and the second word line WL2 of FIG. 4. The tunnel oxide film capacitance Ctox represents the capacitance of a tunnel oxide film Tox interposed between the floating gate FG and the bulk region 10 of FIG. 4.

Referring to FIG. 4 again, a field oxide film Fox operates as an isolation film between the selected cell A and the non-selected cell B. Therefore, a parasitic field transistor is formed between the selected cell A and the non-selected cell B. There is a high probability that the parasitic field transistor is turned on as the channel voltage Vch of the non-selected cell B is higher when the selected cell A is programmed. In addition, it is easier for the parasitic field transistor to turn on as the thickness and the width of the field oxide film Fox are reduced. Accordingly, when the parasitic field transistor is turned on, since undesired leakage current $I_L$ flows from the channel region of the non-selected cell B to the channel region of the selected cell A through the surface of the bulk region 10 under the field oxide film Fox, the channel voltage Vch of the non-selected cell B is lowered. As a result, the non-selected cell B is programmed.

As mentioned above, according to the conventional technology, the non-selected cell may be programmed since the parasitic field transistor between the selected cell and the non-selected cell is easily turned on. In particular, when the width and the thickness of the field oxide film are reduced in order to realize a highly integrated NAND-type flash memory device, the non-selected cell is much more easily programmed.

SUMMARY OF THE INVENTION

It is an objective of the present invention to provide a method for programming a NAND-type flash memory device by which it is possible to prevent a non-selected cell from being programmed though the thickness and the width of a field oxide film are reduced.

To achieve the above objective, there is provided a method for programming a NAND-type flash memory device having a plurality of strings two-dimensionally arranged in a bulk area of a first conductivity type and a plurality of bitlines arranged in parallel on the plurality of strings, comprising applying a bulk bias corresponding to a reverse bias to the bulk area of the first conductivity type, selecting at least one bitline among the plurality of bitlines, selecting at least one string among the plurality of strings connected to at least one selected bitline in parallel, and programming at least one cell among the plurality of cells constructing the selected string.

The bulk area of the first conductivity type is preferably a p-type semiconductor substrate or a p-type well. Also, the respective strings are comprised of a string selection transistor portion, a cell transistor portion, and a ground selection transistor portion, which are sequentially and serially connected to one another. The string selection transistor portion and the ground selection transistor portion are respectively comprised of at least one NMOS transistor. The cell transistor portion is comprised of a plurality of cell transistors which are serially connected to one another. Each cell transistor has a gate structure in which a tunnel oxide film, a floating gate, an inter-poly dielectric layer, and a control gate electrode are sequentially stacked on the bulk area of the first conductivity type. One cell transistor corresponds to one cell. The source area of the NMOS transistor comprising the ground selection transistor portion of each string, i.e., the source area of the ground selection transistor, is connected to a common source line. The drain area of the NMOS transistor comprising the string selection transistor portion, i.e., the drain area of the string selection transistor, is connected to a bitline. Also, the control gate electrode of each cell transistor is connected to a wordline. The bulk area of the first conductivity type is connected to a bulk line. The string selection transistor portion is controlled by at least one string selection line. The ground selection transistor portion is controlled by at least one ground selection line. To be more specific, the gate electrode of the string selection transistor is connected to the string selection line, and the gate electrode of the ground selection transistor is connected to the ground selection line.

The selecting of at least one bitline among the plurality of bitlines is performed by applying a ground voltage or a pulse voltage having a voltage level the same as that of a power supply voltage, for a predetermined time such as a precharge time, to the bitline connected to a string including at least one selected cell to be programmed. At this time, a program inhibition voltage Vpi, preferably, a power supply voltage Vcc is applied to non-selected bitlines among the plurality of bitlines.

Also, the selecting of at least one string is performed by turning on the string selection transistor portion of the string including the selected cell and turning off the ground selection transistor portion of the string including the selected cell. At this time, a ground voltage is applied to the common source line connected to the turned off ground selection transistor portion. When the string selection transistor portion is comprised of one string selection transistor formed of the NMOS transistor, it is possible to turn on the string selection transistor portion by applying the power voltage to the string selection line connected to the gate electrode of the string selection transistor. Also, when the ground selection transistor portion is comprised of one ground selection transistor formed of the NMOS transistor, it is possible to turn off the ground selection transistor portion by applying the ground voltage to the ground selection line connected to the gate electrode of the ground selection transistor.

Also, in the selecting of at least one cell and programming it, a wordline connected to the control gate electrode of the cell to be programmed is selected from among a plurality of wordlines for controlling the cell transistor portion constituting the selected string, and a programming voltage Vpgm, for example, a high voltage of about 18 volts to 20 volts is applied to the selected wordline. At this time, it is preferable that a voltage higher than the program inhibition voltage Vpi and lower than the programming voltage Vpgm, for example, a pass voltage of about 10 volts to 12 volts is applied to the non-selected wordlines excluding the selected wordline.

It is preferable that the bulk bias applied to the bulk area of the first conductivity type, i.e., the p-type semiconductor substrate or the p-type well is −1 volts to −2 volts.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Hereinafter, preferred embodiments of the present invention will be described in detail with reference to the attached drawings.

Figure 1:
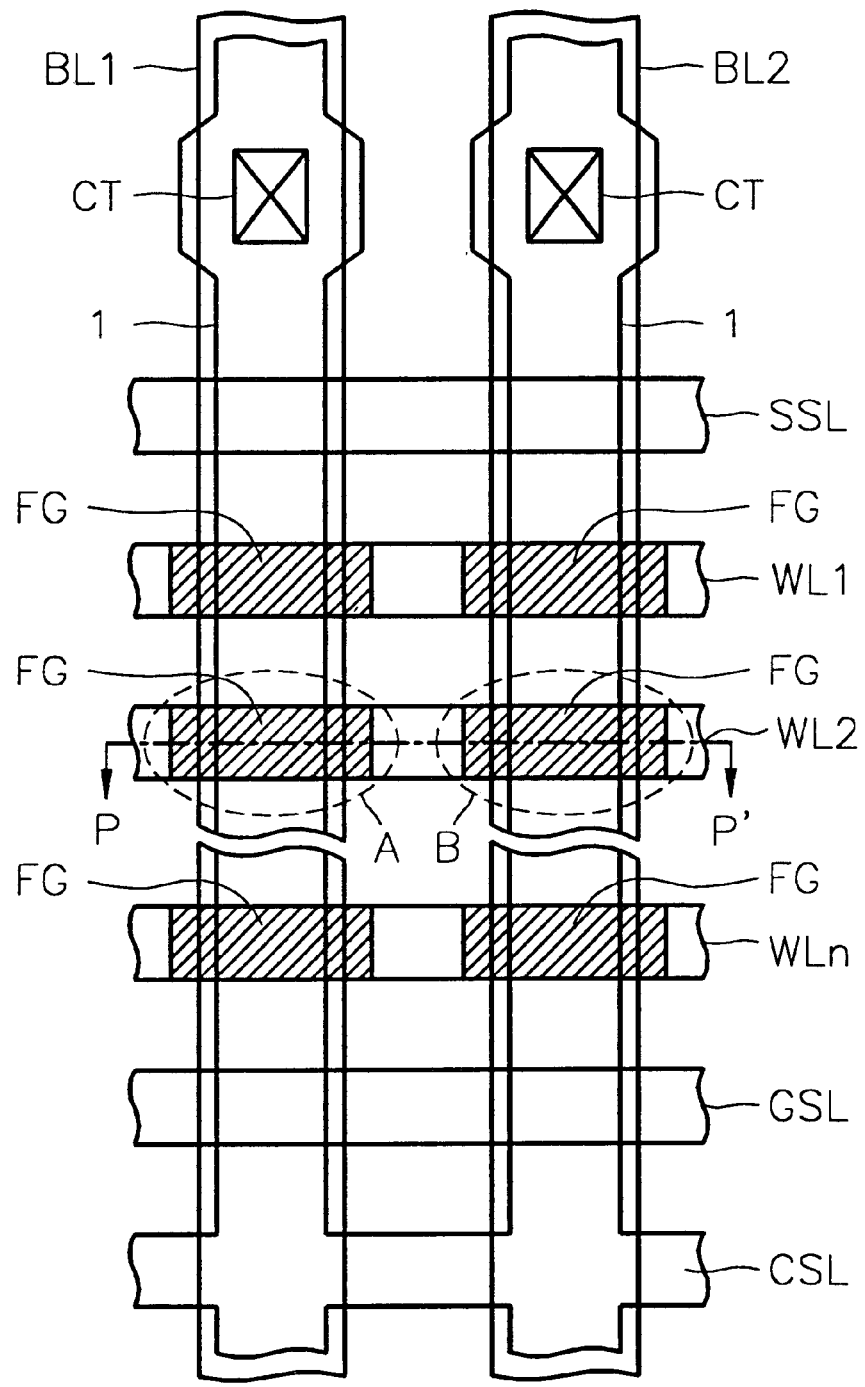
FIG. 1 is a plan view showing part of a cell array area of a general NAND-type flash memory applied to a conventional technology and the present invention.
Figure 2:
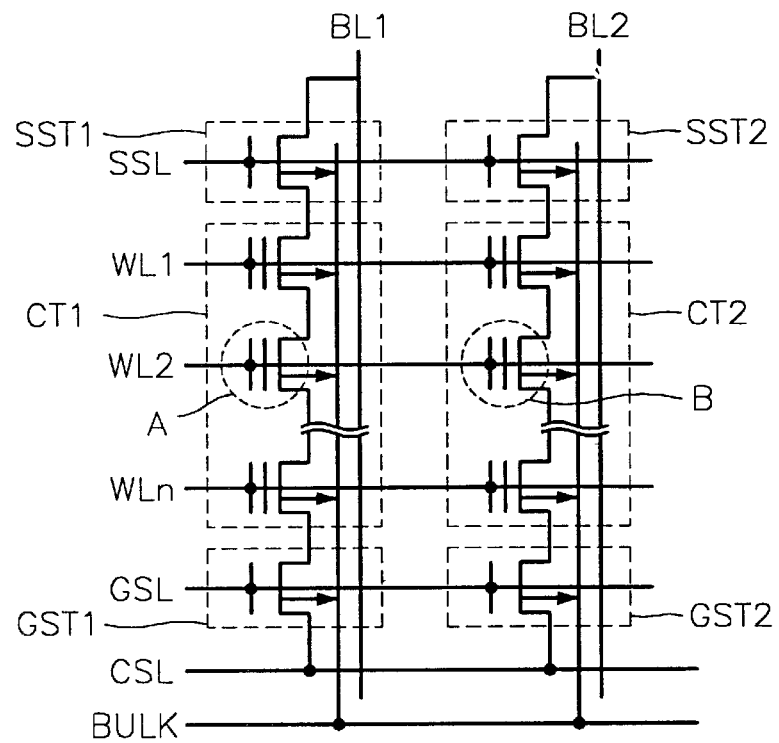
FIG. 2 is an equivalent circuit diagram with respect to the plan view of FIG. 1.
Figure 3:
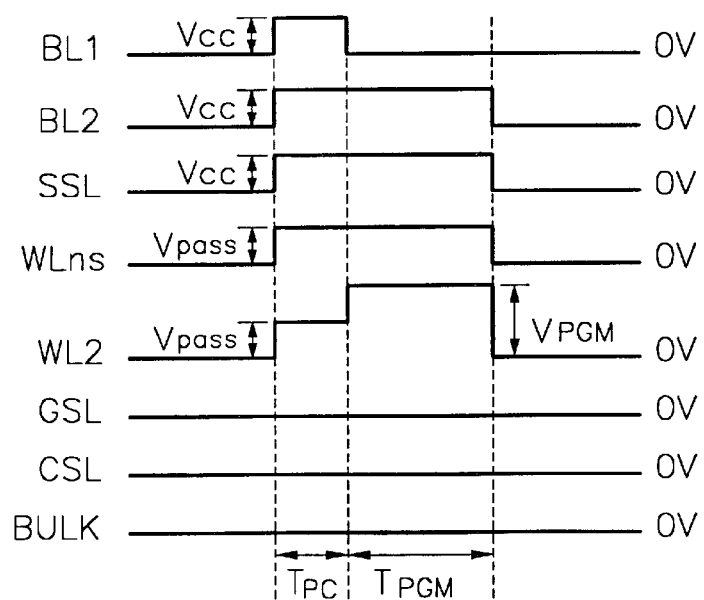
FIG. 3 shows voltage waveforms for describing a method for programming a NAND-type flash memory device according to the conventional technology.
Figure 4:
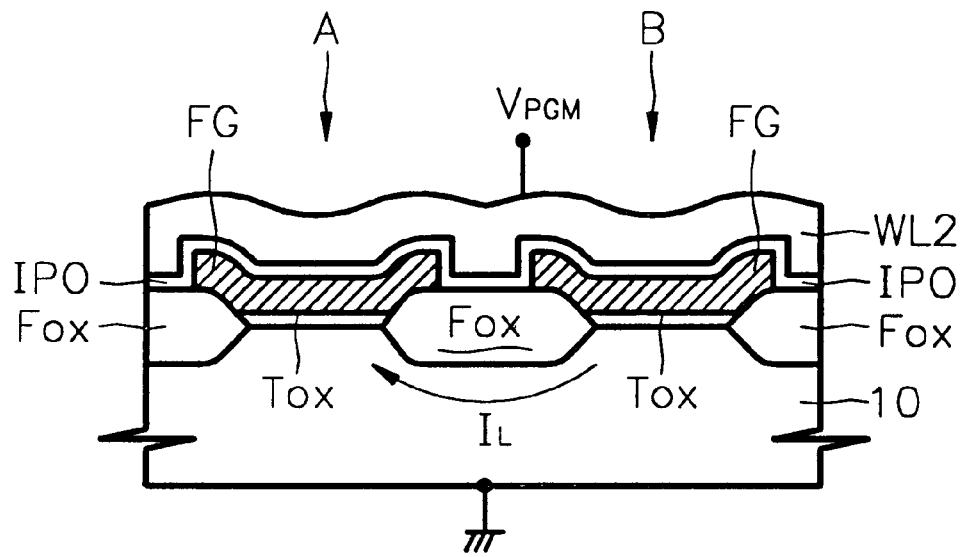
FIG 4 is a sectional view taken along the line PP' of FIG. 1 in order to explain problems of the conventional technology.
Figure 6:
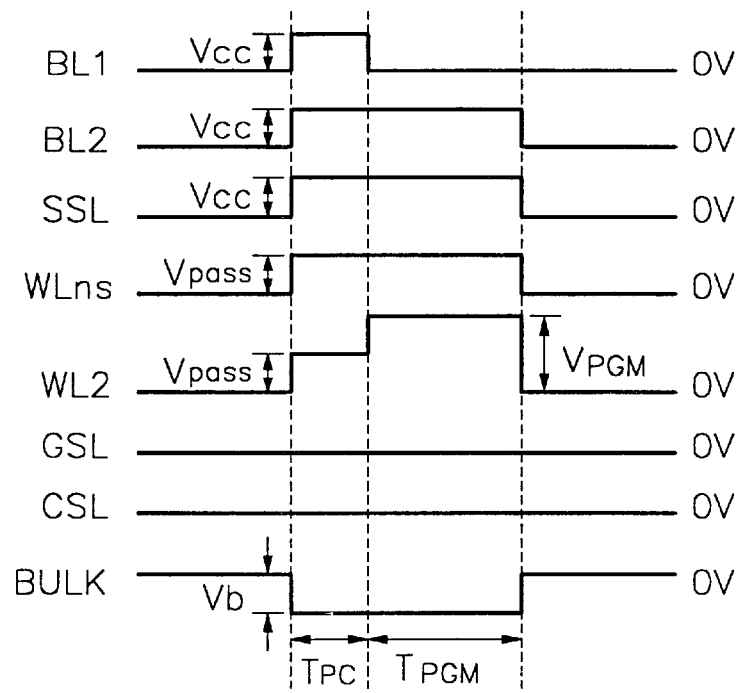
FIG. 6 shows voltage waveforms for describing a method for programming a NAND-type flash memory device according to the present invention.

Referring to FIGS. 2 and 6, when a cell A is to be programmed, a first bitline BL1 is selected by applying a ground voltage or a pulse voltage having a voltage level the same as that of a power supply voltage Vcc, for a predetermined time, i.e., for a precharge time Tpc to the first bitline BL1 connected to a first string including the cell A. At this time, a program inhibition voltage Vpi, preferably, the power supply voltage Vcc is applied to non-selected bitlines excluding the selected first bitline BL1, for example, a second bitline BL2 for the precharge time Tpc and a program time Tpgm. Also, the first string is selected by applying the power supply voltage Vcc and the ground voltage to a string selection line SSL and a ground selection line GSL, connected to the first string including the selected cell A, respectively. At this time, the ground voltage is applied to a common source line CSL connected to the first string.

Also, the cell is selectively programmed by sequentially applying a pass voltage Vpass and a programming voltage Vpgm to a wordline which controls the cell A, i.e., a second wordline WL2. At this time, a voltage higher than the power supply voltage Vcc and lower than the programming voltage Vpgm, that is, preferably a pass voltage Vpass of about 10 volts to 12 volts is applied to the non-selected wordlines (WLns; WL1, WL3, . . . , and WLn) excluding the second wordline WL2. A bulk bias Vb of about −1 volts to −2 volts is applied to a bulk area in which the first and second strings are formed. Here, the voltage applied to the second wordline WL2 may be directly boosted from the ground voltage to the programming voltage Vpgm.

When a predetermined voltage is applied to each control line as mentioned above, the channel area of the selected cell A for the precharge time is precharged and boosted to the voltage applied to the first bitline BL1, i.e., a voltage close to the power supply voltage. When the power supply voltage applied to the first bitline BL1 drops to the ground voltage, charges precharged in the channel area of the selected cell A are discharged through the first bitline BL1 having the ground voltage. Therefore, the channel area of the cell A drops to the ground voltage. Accordingly, electrons are injected into the floating gate of the cell A by an electric field caused by the difference between the programming voltage Vpgm applied to the second wordline WL2 and the ground voltage induced in the channel area of the cell A. Thus, the cell A is selectively programmed for the program time Tpgm. At this time, a voltage which is lower than the programming voltage Vpgm, although enough to turn on the cell transistors, i.e., the pass voltage Vpass is applied to the non-selected wordlines WLns excluding the second wordline WL2. Therefore, excluding the cell A among the plurality of cells, the remaining cells constructing the first string are not programmed.

Figure 5:
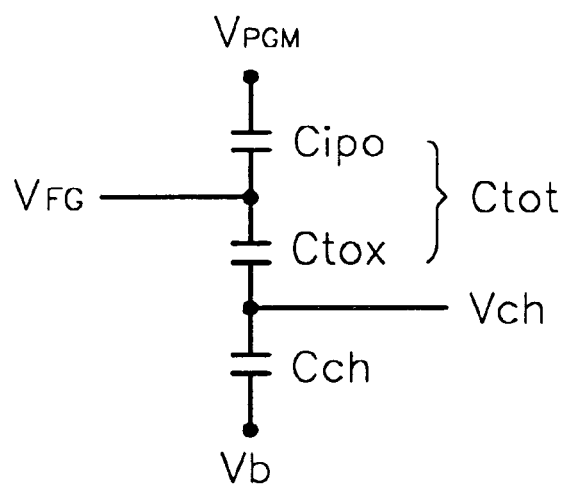
FIG. 5 is an equivalent circuit diagram for describing a boosting effect in the programming methods according to the conventional technology and the present invention.
Figure 7:
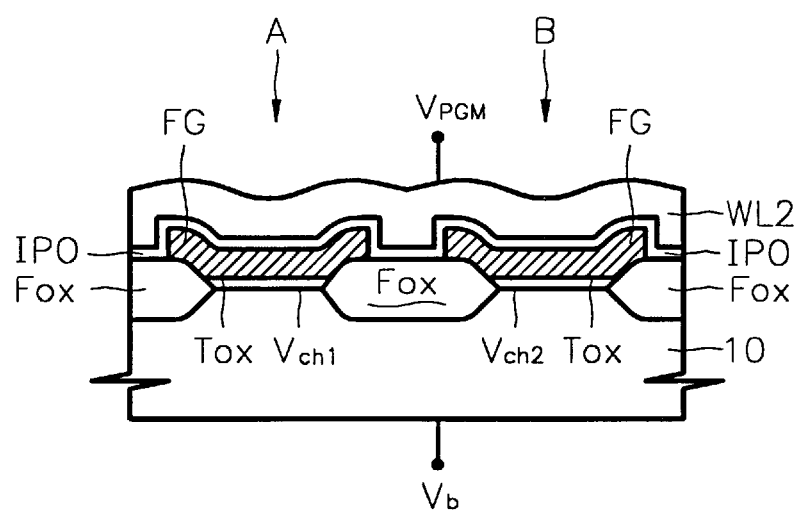
FIG. 7 is a sectional view taken along the line PP' of FIG. 1 in order to explain the effect of the present invention.

The channel area of a non-selected cell B which shares the second wordline WL2 and which is among the plurality of cells constructing the second string is precharged for the precharge time Tpc to the program inhibition voltage Vpi applied to the second bitline BL2, i.e., the voltage close to the power supply voltage Vcc. However, when the programming voltage Vpgm is applied to the second wordline WL2, the channel area of the cell B is self-boosted to a voltage higher than the precharged voltage as described in FIG. 5 and the Equation 1. At this time, the channel areas of all the cells constructing the second string maintain the self-boosted voltage. The self-boosted voltage is not discharged through the second bitline BL2. This is because the string selection transistor constructing the second string is turned off since the voltage of the second bitline BL2 is the same as the voltage of the string selection line SSL. Accordingly, not only the non-selected cell B but also all the cells constructing the second string are not programmed. As shown in FIGS. 6 and 7, according to the present invention, the bulk bias Vb corresponding to a reverse bias is provided for the precharge time and program time to a bulk area 10 in which the first and second strings are formed. Accordingly, although the width and thickness of a field oxide film formed between the cell A and the cell B are reduced, it is possible to remarkably reduce leakage current which flows through the bulk area below the field oxide film Fox due to the difference between a channel area voltage Vch2 of the non-selected cell B and the channel area voltage Vch1 of the selected cell A and the programming voltage Vpgm applied to the second wordline WL2. This is noted from the bulk bias characteristic of the field transistor shown in FIG. 8.

Figure 8:
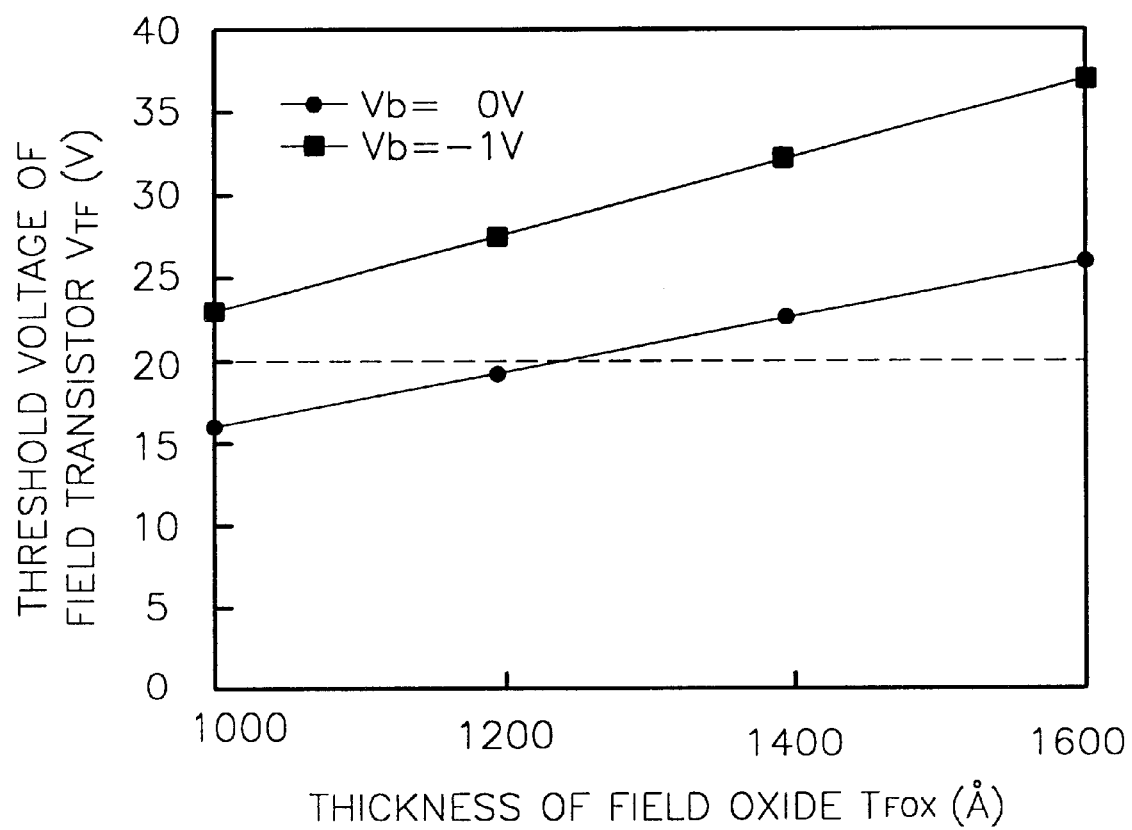
FIG. 8 is a graph showing at bulk bias characteristic of a parasitic field transistor in order to explain the effect of the present invention.

FIG. 8 is a graph showing the result obtained by simulating a threshold voltage characteristic with respect to the bulk bias of the field transistor. The horizontal axis denotes the thickness of the field oxide film Fox. The vertical axis denotes a threshold voltage. Here, the change of the threshold voltage was considered with respect to only the thickness of the field oxide film and the bulk bias and was not considered with respect to the width of the field oxide film. Also, the conductivity type of the bulk area below the field oxide film was a p-type. The doping concentration of the bulk area was $1 \times 10^{18} cm^3$.

Referring to FIG. 8, when the bulk bias Vb is 0 volts and the programming voltage Vpgm applied to the selected wordline, e.g., the second wordline WL2 is 20 volts, the thickness of the field oxide film Fox formed between the selected cell A and the non-selected cell B should be larger than 1,200 Å. In the meantime, when the bulk bias Vb is −1 volts and the programming voltage is 20 volts, a parasitic field transistor is not turned on even though the field oxide film Fox formed between the selected cell A and the non-selected cell B is formed to a thickness of only about 1,000 Å. From this, it is noted that it is possible to remarkably prevent the leakage current from flowing from the channel area of the non-selected cell B to the channel area of the selected cell A. That is to say, when a bulk bias for producing a reverse bias is applied to the bulk area, it is possible to reduce the thickness and width of the field oxide film. Accordingly, it is possible to improve the programming characteristics of a highly integrated NAND-type flash memory device.

The threshold voltage of a general MOS transistor can be represented by the following Equation 2.

$$Vth = Vto + ((\sqrt{2}q \times \epsilon \times Na) \div Cox) \times (\sqrt{|-2\phi f + Vb|} - \sqrt{2}|\phi f|) \quad (2)$$

wherein, $N_a$, $\epsilon$, Cox, $\phi f$, and Vb respectively represent the doping concentration of the bulk area, the permittivity of the bulk area, the capacitance of the gate oxide film, the equilibrium electrostatic potential of the bulk area, and the bulk bias.

It is noted from the Equation 2 that the threshold voltage is proportional to the thickness of the gate oxide film. That is to say, as the thickness of the gate oxide film becomes larger, the amount of change of the threshold voltage with respect to the bulk bias becomes larger. Accordingly, when a bulk bias of about −1 volts to −2 volts is applied to the bulk area, the threshold voltage of the field transistor increases by about 10 volts. Meanwhile, the threshold voltages of the string selection transistor, the ground selection transistor, and the cell transistor, constructing a general string increase by about 1 volt. As a result, when a bulk bias is applied to the bulk area during program operation, the operation of turning on the string selection transistor and the non-selected cell transistor within the selected string is not prohibited by the bulk bias. Therefore, the programming effect increases.

According to the above-mentioned present invention, it is possible to remarkably prevent the non-selected cell from being programmed by applying a reverse bias to the bulk area during the programming operation. Accordingly, it is possible to improve the programming characteristics of the highly integrated NAND-type flash memory device in which the thickness and width of the field oxide film are reduced. Also, it is possible to improve the isolation characteristic when the reverse bias is applied to the bulk area even if the doping concentration of the bulk area below the field oxide film is lowered. Accordingly, it is possible to reduce the junction leakage current of the source and drain areas of the cell transistor. As a result, it is possible to prevent non-selected cells from being programmed by suppressing the self-boosted voltage induced in the channel area of the non-selected cell from being lowered.

The present invention is not restricted to the above embodiments, and it is clearly understood that many variations are possible within the scope and spirit of the present invention by anyone skilled in the art.

What is claimed is:

1. A method for programming a NAND-type flash memory device having a plurality of bitlines arranged in parallel on a bulk area of a first conductivity type and a plurality of strings two-dimensionally arranged on the bulk area and connected to respective bitlines in parallel, wherein each string has a string selection transistor portion, a cell transistor portion, and a ground selection transistor portion, which are sequentially and serially connected, the string selection transistor portion being controlled by at least one string selection line, the cell transistor portion being controlled by a plurality of wordlines, the ground selection transistor portion being controlled by at least one ground selection line, and the ground selection transistor portion being connected to a common source line, comprising:

applying a bulk bias corresponding to a reverse bias to the bulk area of the first conductivity type;

selecting at least one bitline among the plurality of bitlines;

selecting at least one string among the plurality of strings connected to at least one selected bitline in parallel; and selecting at least one cell among the plurality of cells constructing the cell transistor portion of the selected string to thereby program at least one selected cell, wherein the selecting at least one bitline comprises applying a ground voltage to at least one bitline among the plurality of bitlines and applying a program inhibition voltage to non-selected bitlines excluding the at least one bitline, for a precharge time and a programming time respectively.

2. The method of claim 1, wherein the first conductivity type is a p-type.

3. The method of claim 1, wherein at least one bitline is selected by sequentially applying a power supply voltage and a ground voltage to at least one bitline among the plurality of bitlines for a precharge time and a programming time, respectively, and by continuously applying a program inhibition voltage to non-selected bitlines excluding at least one bitline, for a precharge time and a programming time.

4. The method of claim 1, wherein the program inhibition voltage is a power supply voltage.

5. The method of claim 4, wherein the program inhibition voltage is a power supply voltage.

6. The method of claim 1, wherein selecting at least one string comprises turning on and turning off a string selection transistor portion and a ground selection transistor portion, the string selection transistor portion and the ground selection transistor portion constituting at least one string among the plurality of strings connected to at least one selected bitline in parallel, respectively; and applying a ground voltage to a common source line connected to the turned on ground selection transistor portion.

7. The method of claim 6, wherein the string selection transistor portion and the ground selection transistor portion are respectively comprised of one NMOS transistor.

8. The method of claim 7, wherein the string selection transistor portion is turned on by applying a power supply voltage to a string selection line for controlling the string selection transistor portion, and the ground selection transistor portion is turned off by applying a ground voltage to a ground selection line for controlling the ground selection transistor portion.

9. A method for programming a NAND-type flash memory device having a plurality of bitlines arranged in parallel on a bulk area of a first conductivity type and a plurality of strings two-dimensionally arranged on the bulk area and connected to respective bitlines in parallel, wherein each string has a string selection transistor portion, a cell transistor portion, and a ground selection transistor portion, which are sequentially and serially connected, the string selection transistor portion being controlled by at least one string selection line, the cell transistor portion being controlled by a plurality of wordlines, the ground selection transistor portion being controlled by at least one ground selection line, and the ground selection transistor portion being connected to a common source line, comprising:

applying a bulk bias corresponding to a reverse bias to the bulk area of the first conductivity type;

selecting at least one bitline among the plurality of bitlines;

selecting at least one string among the plurality of strings connected to at least one selected bitline in parallel; and selecting at least one cell among the plurality of cells constructing the cell transistor portion of the selected string to thereby program at least one selected cell, wherein selecting at least one cell to thereby program at least one selected cell comprises:

applying a programming voltage to a selected wordline for controlling at least one cell among the plurality of cells within the cell transistor portion of the selected string; and applying a pass voltage Vpass to a non-selected wordline excluding the selected wordline.

10. The method of claim 9, wherein the programming voltage is 18 volts to 20 volts.

11. The method of claim 9, wherein the pass voltage is 10 volts to 12 volts.

12. A method for programming a NAND-type flash memory device having a plurality of bitlines arranged in parallel on a bulk area of a first conductivity type and a plurality of strings two-dimensionally arranged on the bulk area and connected to respective bitlines in parallel, wherein each string has a string selection transistor portion, a cell transistor portion, and a ground selection transistor portion, which are sequentially and serially connected, the string selection transistor portion being controlled by at least one string selection line, the cell transistor portion being controlled by a plurality of wordlines, the ground selection transistor portion being controlled by at least one ground selection line, and the ground selection transistor portion being connected to a common source line, comprising:

applying a bulk bias corresponding to a reverse bias to the bulk area of the first conductivity type;

selecting at least one bitline among the plurality of bitlines;

selecting at least one string among the plurality of strings connected to at least one selected bitline in parallel; and selecting at least one cell among the plurality of cells constructing the cell transistor portion of the selected string to thereby program at least one selected cell, wherein the bulk bias is −1 volts to −2 volts.

* * * * *